Nov. 19, 1957 C. T. McCOY ET AL 2,813,973

DIODE FREQUENCY CONVERTER WITH NON-SINUSOIDAL LOCAL OSCILLATION SOURCE

Filed Jan. 30, 1953 2 Sheets-Sheet 1

INVENTORS
CLAUDIUS T. McCOY
EDWARD CHATTERTON JR.
BY
Brown, Denk & Synnestvedt
AGENTS INVENTORS
CLAUDIUS T. McCOY
EDWARD CHATTERTON JR.
BY
Brown, Denk & Synnestvedt
AGENTS United States Patent Office 2,813,973

Patented Nov. 19, 1957

2,813,973

DIODE FREQUENCY CONVERTER WITH NON-SINUSOIDAL LOCAL OSCILLATION SOURCE

Claudius T. McCoy, Drexel Hill, and Edward Chatterton, Jr., Philadelphia, Pa., assignors to Philco Corporation, Philadelphia, Pa., a corporation of Pennsylvania Application January 30, 1953, Serial No. 334,124

10 Claims. (Cl. 250—20)

The present invention relates to superheterodyne radio wave receiving systems, and more particularly to an improved frequency converter for use in such systems.

It is well known that regions of the radio frequency spectrum lying generally above the upper end of the very high frequency band are characterized by an almost complete absence of atmospheric noise or static. The maximum sensitivity of radio wave receivers operating in these regions is determined largely by the noise generated within the receiver itself. It is also well known that the noise figure of the superheterodyne radio wave receiver, on which the sensitivity depends, is determined largely by the noise figure of the frequency converter since the signal at the converter is usually at a very low level. The signal-to-noise ratio at the output of the converter could be improved by increasing the amplitude of the signal before it is applied to the converter, but this would require a radio frequency amplifier having considerable gain and a noise figure smaller than that of the frequency converter and intermediate frequency amplifier combined. Since it is difficult if not impossible to construct a practical radio frequency amplifier having these characteristics, any improvement of the noise figure of a receiver must be accomplished by improving the noise figure of the converter itself.

The best type of frequency converter in use at ultrahigh and microwave frequencies from the standpoint of noise figure capabilities comprises a crystal diode supplied with both a local oscillator signal and an intelligence-bearing radio wave signal. At microwave frequencies the crystal is suitably mounted in a waveguide, a coaxial line, or other distributed parameter energy transmission means. At ultrahigh frequencies, the crystal may form the part of a lumped parameter circuit. The crystal diode is preferred over the vacuum tube diode because of its better noise figure capabilities.

The noise figure F of a crystal mixer circuit is conveniently expressed in terms of the noise temperature $t_x$ of the crystal, which is a measure of the noise generated within the circuit itself, and the conversion loss $L_x$ of the converter circuit. Since the noise figure F of the converter is equal to the product of these two factors, it follows that reducing either of these factors will lower the noise figure and hence improve the performance of a frequency converter.

Other attempts to improve the noise figures of crystal mixer circuits have concentrated primarily on improving the characteristics of the crystal itself with some effort being placed on providing optimum impedance matches and terminations within the converter circuit for the various frequencies involved. These efforts have resulted in great improvements in the noise figures of converter circuits, but the rapid advance of the radio art requires that the noise figure be reduced below that of the best of the prior known converters.

Until the conception of the present invention it had been assumed that the optimum waveshape for the local oscillator signal supplied to the converter was a perfectly symmetrical, sinusoidal waveform. It was recognized that harmonics of the local oscillator signal were generated by the rectifying action of the crystal and a few experiments had been conducted to determine the effect of providing optimum terminations in the converter for these harmonic frequencies. These experiments yielded only inconclusive results for reasons that will be pointed out in detail in connection with the description of the present invention. In direct contrast to the teachings of the prior art, we have discovered that the noise figure of a frequency converter may be improved by employing a local oscillator signal having a particular type of asymmetry, and that this improvement can be made without sacrificing any of the improvements in noise figure which have been achieved heretofore.

Therefore it is an object of the present invention to provide a novel frequency-converter circuit which is capable of yielding a low overall noise figure.

It is a further object of the present invention to provide a novel frequency converter system employing an asymmetrical local oscillator signal waveform.

Another object of the invention is to provide a simple, novel frequency converter in which the local oscillator signal is caused to have an asymmetric waveform by harmonic reinforcement of the local oscillator signal.

These and other objects of the present invention which will appear as the description of our invention proceeds are generally accomplished by impressing the incoming intelligence-bearing radio wave signal across a diode mixer element. A local oscillator signal, having relatively narrow positive peaks and relatively low negative peaks, is simultaneously impressed across the mixer element. Means are also provided for deriving an intermediate frequency signal from the mixer element. In a preferred embodiment of the invention, the asymmetry of the local oscillator signal is produced by reinforcing a sinusoidal local oscillator signal with a separately generated and selectively phased second harmonic component of the local oscillator signal.

For a better understanding of the present invention together with other and further objects thereof, reference should now be made to the following detailed description of the invention which is to be read in conjunction with the accompanying drawings in which.

Figure 1:
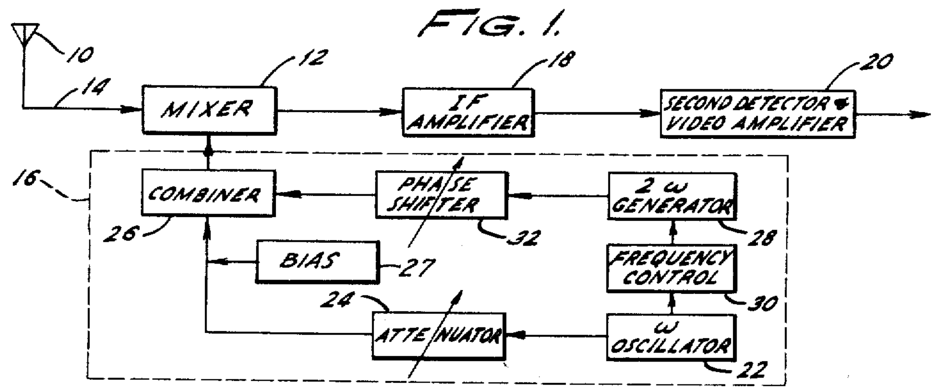
Fig. 1 is a block diagram of one embodiment of the present invention.

In Fig. 1, the antenna symbol 10 represents a conventional microwave or ultrahigh frequency antenna which is connected to a mixer circuit 12 by transmission means 14. Mixer circuit 12 is preferably of the crystal diode type, and transmission means 14 is preferably a waveguide or coaxial line for reasons well known in this art. Mixer 12 receives a second signal from asymmetrical signal generator 16. The signal from generator 16 beats with the signal from antenna 10 in mixer 12 to produce the intermediate frequency signal which is supplied to intermediate frequency amplifier 18. The second detector and video amplifier circuit 20 may be of conventional design.

It is the function of asymmetrical signal generator 16 to generate a signal at a fundamental frequency equal to the sum or difference of the intermediate frequency and the carrier frequency of the radio wave signal supplied to mixer 12 by antenna 10. Preferably this generated signal has relatively high, narrow positive peaks and relatively low, broad negative peaks. The polarities mentioned should be considered in relation to the crystal detector to which they are applied. As used herein, the term positive peak denotes a potential that tends to cause conduction through the crystal in the easy conducting direction. It will be recognized by those skilled in the art that a voltage waveform of this type may be generated in many different ways. Therefore, in its broadest scope, the present invention is not limited to a particular means for generating this signal. However, in the interest of pointing out what are at present considered to be the preferred embodiments of the invention, generator 16 has been shown in Fig. 1 as comprising an oscillator 22 arranged to oscillate sinusoidally at the fundamental frequency of the asymmetrical wave. This signal passes through adjustable attenuator 24 to a signal combiner 26. A source of bias potential 27 may be connected to the same input of signal combiner 26 for providing an appropriate D. C. bias to mixer 12. Signal combiner 26 in its simplest form comprises a section of coaxial line or waveguide having two signals supplied thereto simultaneously. Means 28 are provided for generating a signal at twice the frequency, or at the second harmonic, of the signal supplied by oscillator 22. Generating means 28 may comprise a separate oscillator locked in frequency to oscillator 22 by frequency control means 30, or it may be a frequency doubler or a harmonic generator circuit receiving a control signal from oscillator 22 via frequency control 30. The signal from generator 28 is passed through adjustable phase shifter 32 to a second input to signal combiner 26. The functions of attenuator 24 and phase shifter 32 are to adjust the relative amplitudes of the two signals so that the amplitude of the second harmonic is equal to approximately 0.6 times the amplitude of the signal generated by oscillator 22, and to adjust the relative phases of the two signals so that the positive peaks thereof are substantially in phase. These are believed to be optimum operating conditions for a preferred embodiment of the present invention, but the invention as a whole is not to be strictly limited to these values of phase and amplitude. It should be obvious that the positions of phase shifter 32 and attenuator 24 may be interchanged in some instances or that both may be positioned so as to act on the same signal. However, these are but obvious modifications of the embodiment of the invention shown in Fig. 1.

Figures 2, 3:
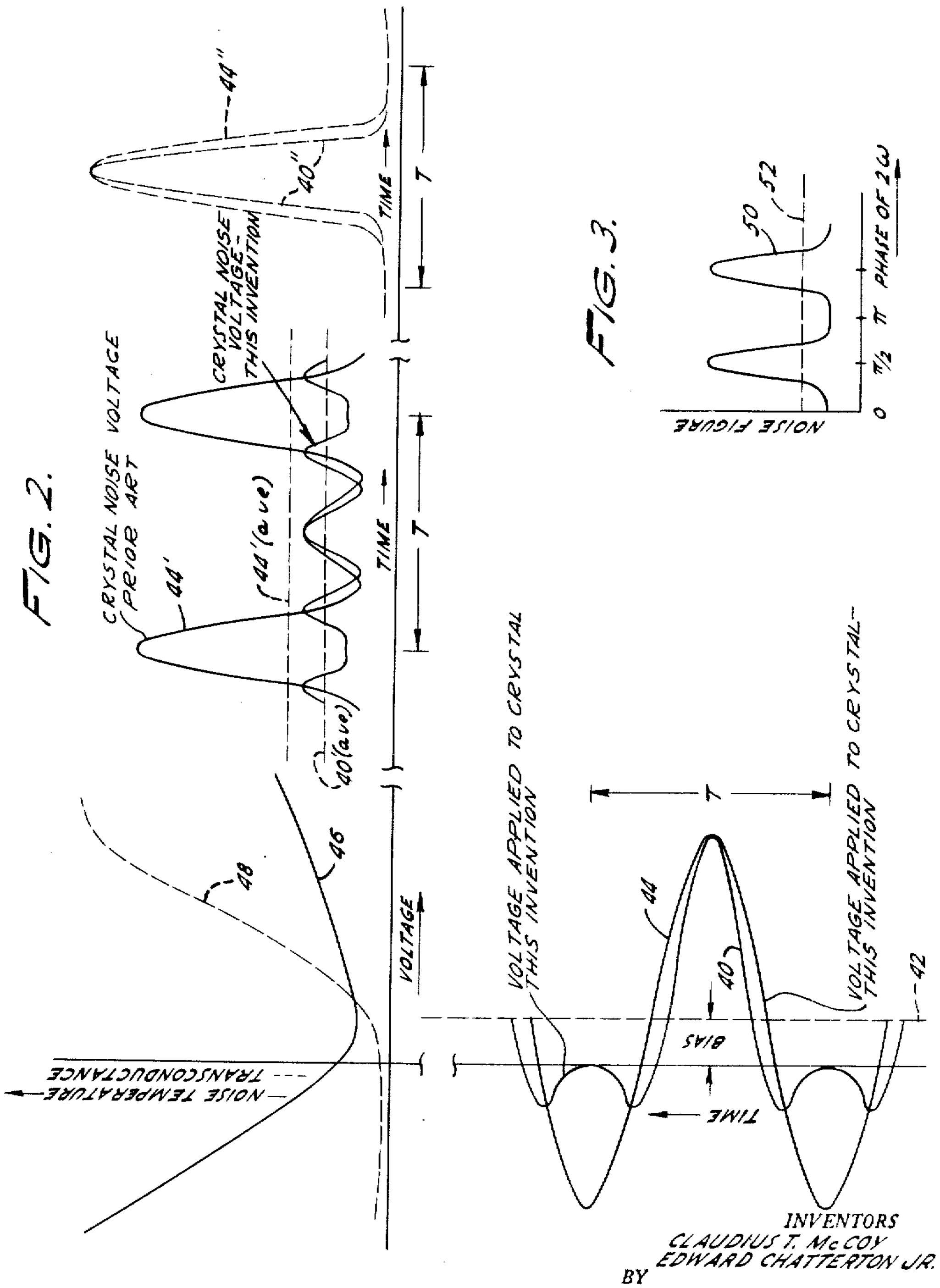
Fig. 2 is a plot of typical waveforms which illustrate the operation of the system of Fig. 1.
Fig. 3 is a plot showing the relationship between converter noise figure and the phase of second harmonic component in an embodiment of the invention operating on the harmonic reinforcement principle.

The operation of the embodiment shown in Fig. 1 will best be understood by reference to Fig. 2. The signal at the output of signal combiner 26 of Fig. 1 is shown at 40 in Fig. 2. Waveform 40 is the sum of sinusodial signals from oscillator 22 and generator 28 taken with the phase and amplitude relationships mentioned above. The average value or D.-C. level of waveform 40 is represented by the broken line 42. It should be noted that this waveform has relatively narrow positive peaks and relatively low, broad, negative peaks. A small positive bias potential is provided in mixer 12 for the purpose of shifting the operating point of the crystal detector. The amplitude of this bias potential is illustrated in Fig. 2 by the spacing between line 42 and the axis. Fig. 1 does not illustrate the source of the bias since crystal biasing circuits are well known in the art.

For the sake of comparison, a sinusodial signal 44 is shown in Fig. 2 superimposed on the same bias potential as waveform 40 and having an amplitude such that the positive peaks of signals 40 and 44 are equal in amplitude. Adjacent waveforms 40 and 44 is a plot of noise temperature $t_x$ of a typical crystal mixer 12 versus the potential applied thereto, the scale of potential being the same as the voltage scale of waveforms 40 and 44. This noise temperature characteristic is represented by the solid line 46 in Fig. 2. One advantage of the present invention over prior art devices is immediately obvious from the curves of Fig. 2. As shown by curve 46 in Fig. 2, the noise temperature of a typical crystal, and hence the instantaneous noise output, is much greater for negative applied potentials than it is for positive applied potentials. The average noise output, or average noise temperature, of the mixer is equal to the average value of the instantaneous noise output. Since the negative peaks of waveform 40 are much lower than those of waveform 44, it is to be expected that the noise output of a mixer supplied with the asymmetrical local oscillator signal 40 will be considerably lower than that of the same crystal supplied with the conventional sinusoidal signal 44.

Waveform 44' illustrates the instantaneous noise output of mixer 12 as a function of time in response to the application of signal 44. The broken line 44' (av.) represents the average of waveform 44', and hence the effective noise generated within the mixed 12 in resonse to conventional sinusoidal excitation. Waveform 40' illustrates the much lower instantaneous noise output in a mixer supplied with the asymmetrical local oscillator signal 40 in accordance with the present invention. The average of waveform 40 is shown as the broken line 40' (av.) in Fig. 2. The reduction of the average noise temperature of the mixer acts directly to reduce the noise figure of the mixer since the noise figure is a product of the noise temperature $t_x$ and the conversion loss $L_x$.

Although it is not immediately apparent from the showing of Fig. 2, it has been found that the relatively narrow positive peaks of waveform 40 tend to reduce the conversion loss $L_x$ in the mixer 12, and hence tend to decrease further the noise figure of the mixer. This is best explained with reference to curve 48 of Fig. 2 which is a plot of the transconductance of a typical crystal mixer as a function of the potential applied thereto. A comparison of waveform 48 with waveforms 40 and 44 will show that the instantaneous variation of crystal transconductance with time, in response to the application of a signal having the waveform 40, will follow the relatively narrow peaked waveform 40'', while the transconductance will vary as shown at 44'' in response to the application of the conventional local oscillator signal 44. If the intelligence-bearing radio wave signal has an amplitude small compared to the amplitude of the local oscillator signal, it can be shown that the conversion loss $L_x$ is given by the expression:

$$L_x=\frac{4\left(g_a+\sqrt{g_a^2-g_f^2/4}\right)^2}{g_f^2}$$

where:

$g_a$ is the average value of the transconductance waveform, and $g_f$ is the fundamental Fourier component of the transconductance waveform.

It can be shown from this equation that the conversion loss decreases rapidly as the ratio $g_f/g_a$ increases. It is well known that this ratio increases as the waveform under consideration approaches a spike function. Therefore the narrower peaked transconductance waveform 40'' will yield a lower conversion loss than the relatively broad transconductance waveform 44''. It should be understood that the shape of waveform 40'' depends upon the shape of curve 48 and the bias voltage applied to the crystal, as well as on the waveshape of the local oscillator signal. However, it will be found that, in general, a signal having the asymmetrical waveform shown at 40 will give a lower conversion loss than the conventional sinusoidal local oscillator signal 44 for most crystals and for all practical values of bias voltages. Maximum reduction of the conversion loss is achieved when the crystal characteristic and the bias potential are selected with the above considerations in mind.

It has been shown that the use of an asymmetrical local oscillator signal waveform of appropriate type decreases the effective noise temperature $t_x$ of the mixer and decreases the conversion loss $L_x$ so that the noise figure F is reduced by an amount proportional to the product of the individual improvements. In an actual embodiment of the invention it makes little difference which factor is reduced so long as the overall noise figure F of the mixer is reduced. Therefore, while the theory of the invention given above is believed to be correct, the invention is not to be strictly limited thereto since experimental data have shown that a reduction in the noise figure F is obtained when the asymmetrical waveform is substituted for the conventional symmetrical waveform.

Curve 50 in Fig. 3 illustrates the effect, on the noise temperature T of a crystal converter, of varying the phase between the fundamental and the second harmonic signal in the asymmetric signal generator 16 of Fig. 1. The horizontal broken line 52 represents the noise temperature of mixer 12 with a conventional sinusoidal local oscillator signal supplied thereto. The increased noise temperature at the points $\pi/2$ and $3\pi/2$ can be explained by the fact that at these phases the asymmetrical signal has large negative peaks and relatively low, broad, positive peaks. The optimum operating conditions from the standpoint of noise temperature reduction are clearly shown to be in the neighborhood of 0, $\pi$ and $2\pi$.

It has been found that the variation of conversion loss with phase shift follows a pattern having maximum points at substantially the same positions as those in the noise temperature curve 50. However, the minimum points are much more sharply defined and are generally located slightly to the left of the $\pi$ and $2\pi$ positions. This shift may be due to the effect of barrier capacity or other factors entering into the conversion process. The net result is that there are critical relationships between the phase of the second harmonic and the fundamental component of the local oscillator signal. These critical relationships are in the neighborhood but not necessarily exactly equal to $\pi$ and $2\pi$ measured at the second harmonic frequency.

The relationship between the phase of the second harmonic component and the noise figure explains in part the failure of previous attempts to reduce the noise figure of a mixer by providing optimum terminations in the mixer for the second harmonic component of the local oscillator signal produced by the mixer itself. It is difficult to insure that the terminations are such that this internally generated signal will combine with the externally applied local oscillator signal in proper phase relationship. However, a second, and perhaps more important, reason exists for the failure of prior attempts in this field. It can be shown that the optimum power level of the second harmonic component is between ½ and ⅓ the power level of the fundamental component. It has been found experimentally that the power of the second harmonic component generated by a typical mixer is only 1/10 to 1/50 that of the applied local oscillator signal. Therefore it is believed that it is impossible to achieve the results described herein merely by providing optimum terminations within the mixer for the second and higher harmonic components of the local oscillator signal generated within the mixer crystal itself.

Figure 4:
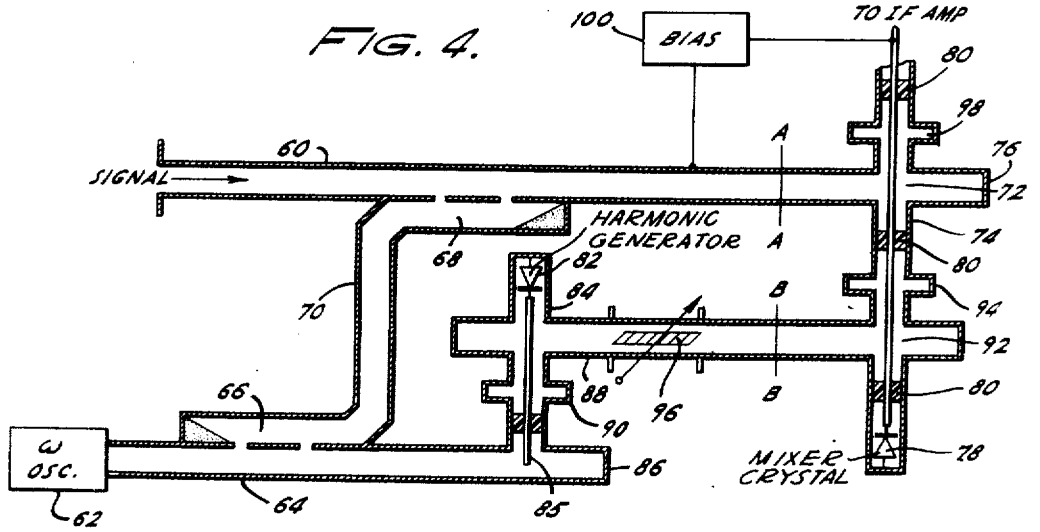
Fig. 4 is a schematic diagram of a microwave embodiment of the present invention.

Fig. 4 illustrates a possible microwave embodiment of the mixer 12-generator 16 portion of the system of Fig. 1. The signal from antenna 10, or some other source of intelligence-bearing microwave frequency signal, is supplied to one end of a waveguide 60. A signal at the fundamental frequency of the local oscillator signal is generated by an oscillator 62 and supplied to a second waveguide 64. Directional couplers 66 and 68 and connecting waveguide 70 comprise means for supplying a portion of the fundamental component of the local oscillator signal to waveguide 60. A waveguide-to-coaxial line transition at 72 is provided to supply both the fundamental local oscillator component and the incoming signal to coaxial line 74. Waveguide 60 is terminated at 76 so as to provide an optimum match at transition 72 for the various signal and image frequencies. Other matching devices (not shown) may be included in guide 60 if necessary to achieve the desired match. The fundamental component of the local oscillator signal, and the incoming signal, are supplied to a crystal 78 coaxially disposed in the end of coaxial line 74. Fig. 4 shows the inner conductor of coaxial line 74 supported by dielectric beads 80; however, coaxial lines having other forms of construction may be substituted without departing from the invention.

The second harmonic component of the local oscillator signal is provided by a harmonic generator comprising a crystal 82 and coaxial line 84. The end of the inner conductor of coaxial line 84 extends into waveguide 64 to form a pickup probe 85. The length and position of the probe 85, and the termination 86 of waveguide 64, are chosen to provide suitable coupling between coaxial line 84 and waveguide 64. A waveguide 88, which is coupled to coaxial line 84 by virtue of the fact that the inner conductor thereof extends therethrough, is so dimensioned that it will propagate the second harmonic component of the local oscillator signal generated by crystal 82 but not the fundamental component of this signal. A suitable choke, shown in Fig. 4 as radial choke 90, blocks the passage of the second harmonic component to waveguide 64. Waveguide 88 is coupled by transition 92 to the coaxial line 74. Since both the fundamental and second harmonic component of the local oscillator signal are present at transition 92, this transition corresponds to combiner 26 of Fig. 1. A second radial choke 94 blocks the passage of the second harmonic signal to waveguide 60 and beyond. An adjustable dielectric vane phase shifter is shown at 96 for controlling the phase of the second harmonic component with respect to the fundamental component. In the preferred embodiment of the invention this phase shifter would be fixed in position once the desired phase relationship is obtained. The intermediate frequency signal is taken from the end of coaxial line 74 extending above waveguide 60 in Fig. 4. A choke 98 is provided for blocking the passage of all signals except the intermediate frequency signal. It is to be understood that all chokes and terminations shown should be appropriately placed to provide proper impedance matches and terminations for the various signals affected thereby. A bias source 100, connected between the inner and outer conductor of coaxial line 74, supplies the appropriate bias to crystal 78. A suitable bias source (not shown) may be provided for crystal 82 if the characteristics of the crystal are such that its efficiency in generating the second harmonic component would be increased thereby.

The operation of the system of Fig. 4 is believed to be obvious from the detailed description of the structure and the preceding description of the system of Fig. 1. Directional couplers 66 and 68 are so arranged that the ratio of the amplitudes of the fundamental and second harmonic components of the local oscillator signal is optimum at crystal 78. In a practical embodiment, the amount of energy extracted from waveguide 64 by directional coupler 66 will be small compared to the amount extracted by probe 85 since the efficiency of crystal 82 in converting energy at the fundamental frequency to energy at the second harmonic frequency is relatively low. The fundamental component of the local oscillator signal traveling by the way of waveguide 60 and coaxial line 74 combines with the second harmonic component at transition 92 to form the asymmetrical signal 40 of Fig. 2. Although Fig. 4 shows all of the components lying in a common plane it should be well understood that, from the standpoint of mechanical and electrical design, it may be desirable to depart from this arrangement and to use other forms of coupling devices, chokes, etc. For this reason no stress has been placed on the coplanar arrangement or on dimensions of the various elements either in terms of absolute units or in terms of wavelengths at the operating frequency. However, it is believed that the description is sufficiently detailed to permit those skilled in the art to practice the invention by applying only elementary design considerations.

Figure 5:
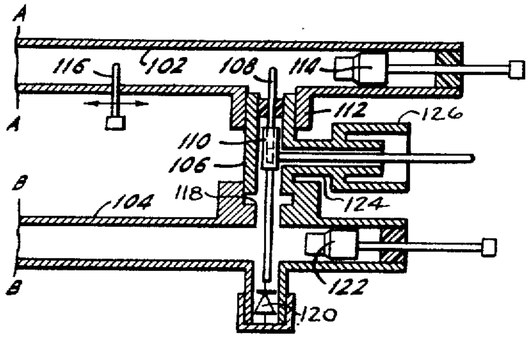
Fig. 5 is a modified form of the mixer assembly of Fig. 4.

Fig. 5 illustrates a modified form of the structure lying to the right of the line A—A and B—B in Fig. 4. Waveguides 102 and 104 in Fig. 5 constitute extensions of waveguides 60 and 88 of Fig. 4. Waveguides 102 and 104 are joined by a section of coaxial line 106 which corresponds in function to coaxial line 74 in Fig. 4. However, transmission line 106 is coupled to waveguide 102 by probe 108 which forms an extension of the inner conductor of transmission line 106. The end of the inner conductor of coaxial line 106 is formed with an enlarged portion 110 having an opening formed therein to receive probe 108. This arrangement permits the depth of penetration of probe 108 into waveguide 102 to be adjusted. A sleeve 112, which surrounds the outer conductor of coaxial line 106, permits movement of line 106 in a vertical direction with respect to waveguide 102 without interrupting the electrical contact between coaxial line 106 and waveguide 102. Movement of coaxial line in this manner is sometimes desirable during the preliminary adjustment of the mixer. Probe 108 and sleeve 112 may be fixed in position by any suitable means once optimum settings of these elements have been determined. An adjustable tuning plunger 114, and a roving stub tuner 116, are provided for the purpose of assisting in the matching of the signal and image frequency terminations of the mixer.

Choke 118 and crystal 120 correspond to choke 94 and crystal 78 of Fig. 4. A second adjustable tuning plunger 122 is provided in the end of waveguide 104 to permit optimum matching of the second harmonic signal at the transition formed by coaxial line 106 and waveguide 104.

The intermediate frequency signal is extracted from the mixer of Fig. 5 by way of coaxial line 124 which forms a T-junction with coaxial line 106. A R. F. choke 126 is provided at the end of the outer conductor of line 124 to block the passage of all signals except the intermediate frequency signal.

Figure 6:
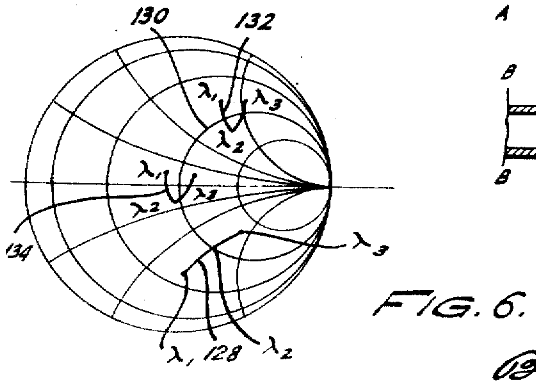
Fig. 6 is an impedance diagram relating to the embodiment shown in Fig. 5.

The advantages of the arrangement of Fig. 5 are best explained by reference to the impedance diagram or Smith Chart shown in Fig. 6. The impedances seen looking into coaxial line 106 at probe 108 for the incoming signal, the fundamental component of the local oscillator signal and the image signal are shown by curve 128 in Fig. 6 where the points $\lambda_1$, $\lambda_2$ and $\lambda_3$ represent the three signals mentioned above. The shape of curve A, and its position on the impedance diagram, may be adjusted, by varying the position of the probe 108, plunger 114 and the position of coaxial line 106 within sleeve 112, so that, at some point along the waveguide 102, the impedances at the three frequencies are grouped around the unity conductance circle 130 as shown by curve 132. The curvature in curve 132 is accounted for by the fact that the same physical distance in waveguide 102 corresponds to slightly different electrical distances measured at the three frequencies. In making the adjustment mentioned above it would be well to remember that the real part of curve 128 is controlled mainly by the position of probe 108, while the reactive part is controlled mainly by plunger 114. Roving stub tuner 116 is positioned in waveguide 102 at the point at which the impedances are as shown in curve 132. Tuner 116 is adjusted to insert the proper reactance to translate curve 132 to the position shown at 134. Since curve 134 is approximately at the center of the Smith Chart, it is apparent that the impedance of waveguide 102, as seen looking into the left hand end thereof for signals having frequencies represented by the points $\lambda_1$, $\lambda_2$ and $\lambda_3$, will be approximately equal to the characteristic impedance of the waveguide 102.

To summarize very briefly the novel features of the invention described in detail above, we have provided a new and improved frequency converter system in which the local oscillator waveform is caused to have a particular asymmetrical shape. We have shown that the desired asymmetrical shape may be obtained by reinforcing a sinusoidal local oscillator signal with a second harmonic component of appropriate amplitude and phase. In addition we have disclosed two microwave embodiments of the present invention embodying the harmonic reinforcement principle.

While we have described what are at present considered to be the preferred embodiments of our invention, it is to be understood that various changes and modifications may be made therein without departing from the spirit and scope of the hereinafter appended claims.

What is claimed is:

1. A heterodyne frequency converter having a relatively low noise figure comprising a mixer crystal, means for impressing a signal to be heterodyned across said mixer crystal, means for generating a substantially sinusoidal local oscillator signal at a frequency different from the frequency of the signal to be heterodyned by the desired intermediate frequency, means for generating a signal at twice the frequency and approximately 0.6 times the amplitude of said local oscillator signal, means for combining said local oscillator signal and said double frequency signal with the positive peaks thereof approximately in phase, means for biasing said mixer crystal in the forward direction, the amplitude of said forward bias being approximately equal to 0.4 times the peak amplitude of said local oscillator signal, means for impressing said combined signal across said mixer crystal with such a polarity that the in phase positive peaks tend to cause conduction through said mixer element in the direction of easier conduction and means for deriving an intermediate frequency signal from said mixer crystal.

2. A heterodyne frequency converter having a relatively low noise figure comprising a high frequency signal transmission means having first and second current carrying paths, a mixer crystal connected between said current carrying paths, means for supplying a signal to be heterodyned to said signal transmission means, means for supplying a substantially sinusoidal local oscillator signal to said signal transmission means, said local oscillator signal having an amplitude much greater than that of the signal to be heterodyned and a frequency differing from the frequency of the signal to be heterodyned by the desired intermediate frequency, means for supplying a second substantially sinusoidal signal to said signal transmission means, said second sinusoidal signal having a frequency twice that of said local oscillator signals, an amplitude 0.6 times that of said local oscillator signal, and a phase such that alternate positive peaks thereof are approximately in time coincidence with positive peaks of said local oscillator signal, said mean for supplying said local oscillator signal and said second signal to said signal transmission means being so arranged that said coincident peaks tend to cause conduction through said mixer crystal in the direction of easier conduction, means for biasing said mixer crystal in the forward direction, the amplitude of said forward bias being approximately equal to 0.4 times the peak amplitude of said local oscillator signal, and an impedance connected between said current carrying paths for deriving an intermediate frequency signal from said mixer crystal.

3. A heterodyne frequency converter having a relatively low noise figure comprising, means for generating a local oscillator signal having a frequency differing from that of the signal to be heterodyned by the desired intermediate frequency, means for generating a harmonic reinforcing signal at twice the frequency of said local oscillator signal, a first hollow waveguide coupled to said local oscillator generating means, said first waveguide being dimensioned to propagate said local oscillator signal and said signal to be heterodyned, means for injecting the signal to be heterodyned into said first waveguide, a second hollow waveguide coupled to said harmonic signal generating means, said second waveguide being dimensioned to propagate said harmonic signal but not said local oscillator signal, a coaxial line coupled to said two waveguides, said coaxial line forming a cross transition with at least one of said waveguides, said coaxial line being terminated a preselected distance from said cross transition, a mixer crystal connected in series with the inner conductor of said coaxial line in the region of said termination, said waveguides and said coaxial lines being so dimensioned and arranged that positive peaks of said local oscillator signal occur in time coincidence with the positive peaks of said harmonic reinforcing signal at said mixer crystal, said positive peaks being peaks which tend to cause conduction through said mixer crystal in the direction of easier conduction, and means for deriving an intermediate frequency signal from said coaxial line.

4. A heterodyne frequency converter having a relatively low noise figure comprising, means for generating a substantially sinusoidal local oscillator signal having a frequency differing from that of the signal to be heterodyned by the desired intermediate frequency, a first waveguide dimensioned to propagate said local oscillator signal coupled to said generating means, a second waveguide dimensioned to propagate said local oscillator signal and the signal to be heterodyned, means for supplying the signal to be heterodyned to said second waveguide, means associated with said first and second waveguides for supplying a predetermined fraction of said local oscillator signal in said first waveguide to said second waveguide, second harmonic generating means including a diode crystal, means coupling said harmonic generating means to said first waveguide, a third waveguide dimensioned to propagate said second harmonic signal coupled to said harmonic generating means, a coaxial line coupled to said second and third waveguides so as to receive signals from both of said waveguides, said coaxial line forming a cross transition with at least one of said second and third waveguides, said waveguide included in said cross transition being terminated a preselected distance from said cross transition, a mixer crystal connected in series with the inner conductor of said transmission line in the region of said termination, said waveguides and said coaxial line beng so dimensioned and arranged that positive peaks of said local oscillator signals occur in time coincidence with the positive peaks of said harmonic signal at said mixer crystal, said positive peaks being peaks which tend to cause conduction through said mixer crystal in the direction of easier conduction, and means for deriving an intermediate frequency signal from said coaxial line.

5. For use in a harmonic reinforcement frequency converter, a mixer assembly comprising a first waveguide dimensioned to propagate the fundamental local oscillator signal and the signal to be heterodyned, an adjustable shorting means closing one end of said first waveguide, a coaxial transmission line coupled to said first waveguide, the inner conductor of said transmission line extending within said waveguide as a probe, said inner conductor being adjustable in length to vary the insertion of said probe in said first waveguide, said first waveguide being formed with a sleeve on one of the broad walls thereof to receive slidably the outer conductor of said coaxial line, means for inserting a reactance in said first waveguide at a preselected distance from said probe, a second waveguide dimensioned to propagate the second harmonic of said local oscillator signal, said second waveguide forming a cross transition with said coaxial line adjacent the end thereof remote from said first waveguide, adjustable shorting means closing one end of said second waveguide, a mixer crystal connected between the inner and outer conductors of said coaxial line adjacent said last-mentioned end of said coaxial line, a second coaxial line forming a T-junction with said first coaxial line intermediate said first and second waveguides, said second transmission line including choke means for blocking said local oscillator signals and said signal to be heterodyned, and means disposed between said T-junction and said second waveguide for blocking the passage of said second harmonic signal.

6. A heterodyne frequency converter having a relatively low noise figure comprising, means for generating a local oscillator signal having a frequency differing from that of the signal to be heterodyned by the desired intermediate frequency, means for generating a harmonic reinforcing signal at twice the frequency of said local oscillator signal, a first hollow waveguide coupled to said local oscillator generating means, said first waveguide being dimensioned to propagate said local oscillator signal and said signal to be heterodyned, means for injecting the signal to be heterodyned into said first waveguide, a second hollow waveguide coupled to said harmonic signal generating means, said second waveguide being dimensioned to propagate said harmonic signal but not said local oscillator signal, a coaxial line coupled to said two waveguides, said coaxial line forming a cross transition with at least one of said waveguides, said coaxial line being terminated a preselected distance from said cross transition, a mixer crystal connected in series with the inner conductor of said coaxial line in the region of said termination, said waveguides and said coaxial line being so dimensioned and arranged that positive peaks of said local oscillator signal occur in time coincidence with the positive peaks of said harmonic reinforcing signal at said mixer crystal, said positive peaks being peaks which tend to cause conduction through said mixer crystal in the direction of easier conduction, said waveguides, said coaxial lines, said source of local oscillator signal and said source of harmonic reinforcing signal being further arranged so that the amplitude of the harmonic reinforcing signal impressed across said crystal is approximately equal to 0.6 times the amplitude of the local oscillator signal impressesd across said crystal, means for biasing said crystal in the forward direction by an amount equal to approximately 0.4 times the peak amplitude of said local oscillator signal impressed across said crystal, and means for deriving an intermediate frequency signal from said coaxial line.

7. A heterodyne frequency converter having a relatively low noise figure comprising, means for generating a local oscillator signal having a frequency differing from that of the signal to be heterodyned by the desired intermediate frequency, means for generating a harmonic reinforcing signal at twice the frequency of said local oscillator signal, a first hollow waveguide coupled to said local oscillator generating means, said first waveguide being dimensioned to propagate said local oscillator signal and said signal to be heterodyned, a second hollow waveguide coupled to said harmonic signal generating means, said second waveguide being dimensioned to propagate said harmonic signal but not said local oscillator signal, a coaxial line coupled to said two waveguides, said coaxial line forming a separate cross transition with each one of said waveguides, said coaxial line being terminated a preselected distance from said cross transition with said second waveguide, a mixer crystal connected in series with the inner conductor of said coaxial line in the region of said termination, said waveguides and said coaxial lines being so dimensioned and arranged that the positive peaks of said local oscillator signal occur in time coincidence with the positive peaks of said harmonic reinforcing signal at said mixer crystal, said positive peaks being peaks which tend to cause conduction through said mixer crystal in the direction of easier conduction, means for biasing said crystal in the forward direction and means for deriving an intermediate frequency signal from the end of said coaxial line remote from said termination.

8. A heterodyne frequency converter in accordance with claim 7, said frequency converted further comprising a choke disposed in said coaxial line intermediate said two cross transitions, said choke effectively blocking the passage of said harmonic reinforcing signal.

9. A heterodyne frequency converter having a relatively low noise figure comprising, means for generating a local oscillator signal having a frequency differing from that of the signal to be heterodyned by the desired intermediate frequency, a first hollow waveguide system coupled to said local oscillator generating means, said first waveguide system being dimensioned to propagate said local oscillator signal and said signal to be heterodyned, means for introducing said signal to be heterodyned into said first waveguide system, means coupled to said first waveguide system for deriving from said local oscillator signal a harmonic reinforcing signal at twice the frequency of said local oscillator signal, a second hollow waveguide coupled to said harmonic signal generating means, said second waveguide being dimensioned to propagate said harmonic signal but not said local oscillator signal, a coaxial line forming a first cross transition with said first waveguide system and a second cross transition with said second waveguide, said coaxial line being terminated a preselected distance from said second cross transition, a mixer crystal connected in series with the inner conductor of said coaxial line in the region of said termination, choke means associated with said coaxial line intermediate said first and second cross transitions for blocking said harmonic reinforcing signal, said first waveguide system, said second waveguide and said coaxial line being so dimensioned and arranged that positive peaks of said local oscillator signal occur in time coincidence with the positive peaks of said harmonic reinforcing signal at said mixer crystal, said positive peaks being peaks which tend to cause conduction through said mixer crystal in the direction of easier conduction, means for supplying a D. C. bias between the inner and outer conductors of said coaxial line, and means for deriving an intermediate frequency signal from said coaxial line.

10. For use in a harmonic reinforcement frequency converter, a mixer assembly comprising a first waveguide dimensioned to propagate the fundamental local oscillator signal and the signal to be heterodyned, said first waveguide being terminated at one end in a short circuit, a coaxial transmission line coupled to said first waveguide, the inner conductor of said transmission line extending within said first waveguide as a probe, a second waveguide dimensioned to propagate the second harmonic of said local oscillator signal, said second waveguide forming a cross transition with said coaxial line adjacent the end thereof remote from said waveguide, said second waveguide being terminated at one end in a short circuit, a mixer crystal connected between the inner and outer conductors of said coaxial line at a point between said last-mentioned end of said coaxial line and said cross transition, a second coaxial line forming a T-junction with said first coaxial line intermediate said first and second waveguides, said second transmission line including choke means for blocking said local oscillator signals and said signal to be heterodyned, and means disposed between said T-junction and said second waveguide for blocking the passage of said second harmonic signal.

References Cited in the file of this patent

UNITED STATES PATENTS

| | | |
|---|---|---|
| 2,159,493 | Wright | May 23, 1939 |
| 2,171,154 | Wright | Aug. 29, 1939 |
| 2,512,614 | Earp | June 27, 1950 |
| 2,640,919 | Bell et al. | June 2, 1953 |
| 2,721,936 | Byrne et al. | Oct. 25, 1955 |
| 2,773,979 | Chatterton | Dec. 11, 1956 |

FOREIGN PATENTS

| | | |
|---|---|---|
| 974,565 | France | Oct. 4, 1950 |

UNITED STATES PATENT OFFICE

CERTIFICATE OF CORRECTION

Patent No. 2,813,973 November 19, 1957

Claudius T. McCoy et al.

It is hereby certified that error appears in the above numbered patent requiring correction and that the said Letters Patent should read as corrected below.

In the drawing, Sheet 2, Figure 2, legend on curve 44, for "THIS INVENTION" read --PRIOR ART--; in the printed specification, column 4, line 18, for "mixed 12" read --mixer 12--; column 6, line 60, for "82 in" read --82 is--; column 7, line 36, for "A R. F. choke" read --An R. F. choke--; column 8, line 52, for "mean" read --means--; column 9, line 43, for "beng" read --being--; column 10, line 72, for "converted" read --converter--.

Signed and sealed this 11th day of March 1958.

(SEAL)
Attest:
KARL H. AXLINE
Attesting Officer

ROBERT C. WATSON
Commissioner of Patents